(12) United States Patent
Shuto

(10) Patent No.: US 6,335,876 B1
(45) Date of Patent: Jan. 1, 2002

(54) SEMICONDUCTOR MEMORY AND METHOD OF TESTING THE SAME

(75) Inventor: Susumu Shuto, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/661,441

(22) Filed: Sep. 13, 2000

(30) Foreign Application Priority Data

Sep. 14, 1999 (JP) .......................... 11-260999

(51) Int. Cl.$^7$ .................... G11C 11/22; G11C 7/00
(52) U.S. Cl. .......................... 365/145; 365/201
(58) Field of Search .................. 365/145, 201, 365/230.06, 149, 117

(56) References Cited

U.S. PATENT DOCUMENTS 5,270,967 A * 12/1993 Moazzami et al. ......... 365/145
5,889,696 A * 3/1999 Kawakubo et al. ......... 365/145
5,978,251 A * 11/1999 Kraus et al. ............... 365/145
6,125,051 A * 9/2000 Kang ......................... 365/145

* cited by examiner

*Primary Examiner*—Richard Elms
*Assistant Examiner*—Anh Phung
(74) *Attorney, Agent, or Firm*—Oblon, Spivak, McClelland, Maier & Neustadt, P.C.

(57) ABSTRACT

In steps S12 and S18, write and erase tests for a ferroelectric memory are performed, and remanent polarization is produced in a ferroelectric capacitor. Before the flow advances from these testing steps to another step, in steps S14 and S20 the remanent polarization is removed. This remanent polarization removal is performed such that the absolute value of the remanent polarization is smaller than the absolute value of polarization remaining in the ferroelectric capacitor in normal operation. This prevents the ferroelectric capacitor from causing imprint by thermal history after the testing steps, thereby improving the characteristics and preventing shortening of the product life.

8 Claims, 7 Drawing Sheets

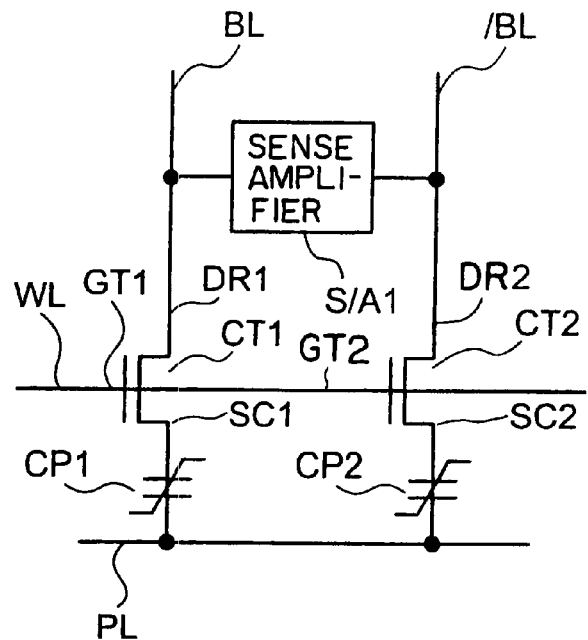
F I G. 11
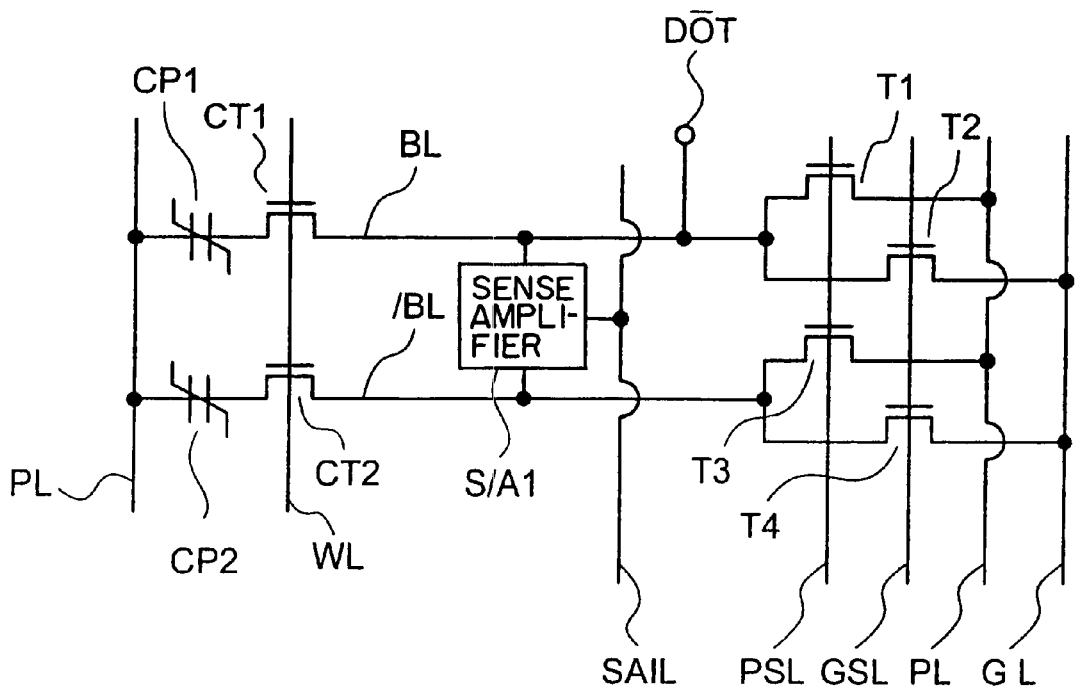
F I G. 12

SEMICONDUCTOR MEMORY AND METHOD OF TESTING THE SAME

BACKGROUND OF THE INVENTION

The present invention relates to a semiconductor memory and a method of testing the same and, more particularly, to removal of remanent polarization in a ferroelectric memory.

A ferroelectric memory relevant to the present invention is shipped after being subjected to testing and package assembly through steps as shown in FIG. 13.

In step S10, semiconductor chips are fabricated in units of semiconductor wafers. In step S12, the semiconductor wafers are tested one by one. In step S16, the wafers are diced to package/assemble chips. In step S18, a final product test is conducted. In step S22, the products are shipped.

In the tests in steps S12 and S18, writes and erases to ferroelectric capacitors are performed.

In this method, however, the testing steps are completed with polarization remaining in ferroelectric capacitors. When the flow advances to the subsequent steps in this state, the characteristics of the ferroelectric capacitors deteriorate by thermal history. This reduces the data read amount and causes a phenomenon so-called imprint.

For example, in the package assembly step instep S16, after semiconductor chips are encapsulated with resin, heat of about 170 to 200° C. is applied for about 1 hr. In this step, a ferroelectric capacitor in which polarization remains causes imprint and deteriorates its characteristics. This shortens the life of the capacitor as a product.

Also, when a memory is shipped with polarization remaining in a ferroelectric capacitor, imprint occurs if careless thermal history is applied during storage before actual use. This shortens the product life after that. In this method relevant to the present invention as described above, the testing steps are completed while polarization produced by write operations during these steps remains. This remanent polarization degrades the characteristics and shortens the product life.

SUMMARY OF THE INVENTION

It is, therefore, an object of the present invention to provide a semiconductor memory and a method of testing the same, which can prevent deterioration of the characteristics and shortening of the product life caused by remanent polarization in testing steps.

A semiconductor memory testing method of the present invention is a method of testing a semiconductor memory having a memory cell including a ferroelectric capacitor, comprising a second write testing for the semiconductor memory, and removing remanent polarization such that an absolute value of polarization remaining in the ferroelectric capacitor is smaller than an absolute value of polarization remaining in normal operation.

In this method, the remanent polarization removing step can comprise writing identical data in all memory cells, and setting, in a block from which remanent polarization is to be removed, a bit line connected to the memory cells at a predetermined voltage and applying a remanent polarization removing plate line voltage lower than a voltage in normal write operation to a plate line connected to the memory cells, and the remanent polarization removing plate line voltage can be substantially equal to or higher than a coercive voltage of the ferroelectric capacitor.

A semiconductor memory of the present invention comprises a cell array in which a plurality of memory cells each including a ferroelectric capacitor are arranged, and a write circuit for writing data in the memory cells, the write circuit removing polarization remaining in the ferroelectric capacitor by applying a voltage lower than a voltage in normal operation to a plate line connected to the memory cell, such that an absolute value of polarization remaining in the ferroelectric capacitor is smaller than an absolute value of polarization remaining in normal operation.

Another semiconductor memory of the present invention comprises a cell array in which a plurality of memory cells each including a ferroelectric capacitor are arranged, a plate line driver for applying a supplied voltage to a plate line connected to the memory cells, a plate line voltage generating circuit for generating a remanent polarization removing plate line voltage lower than a normal operation plate line voltage, and a switching circuit for selectively supplying, to the plate line driver, one of the normal operation plate line voltage given and the remanent polarization removing plate line voltage generated by the plate line voltage generating circuit, wherein when performing a normal operation, the switching circuit supplies the normal operation plate line voltage to the plate line driver to apply the voltage to the plate line, when removing remanent polarization from the ferroelectric capacitor, the switching circuit supplies the remanent polarization removing plate line voltage to the plate line driver to apply the voltage to the plate line, such that an absolute value of polarization remaining in the ferroelectric capacitor is smaller than an absolute value of polarization remaining in normal operation.

In this semiconductor memory, the switching circuit can be externally given a command and selectively supply one of the normal operation plate line voltage and the remanent polarization removing plate line voltage to the plate line driver.

Alternatively, the switching circuit can comprise a first switching element having a control terminal connected to an external terminal, an input terminal to which the normal operation plate line voltage is input, and an output terminal connected to an input terminal of the plate line driver, and a second switching element having the control terminal connected to the external terminal, an input terminal to which the remanent polarization removing plate line voltage is input, and an output terminal connected to an input terminal of the plate line driver, and one of the first and second switching elements can be turned on in accordance with a signal input to the external terminal, thereby supplying one of the normal operation plate line voltage and the remanent polarization removing plate line voltage to the plate line driver.

Also, the plate line voltage generating circuit can comprise a plurality of resistors or diodes connected in series between a power terminal and a ground terminal, and a plurality of fuses connected between nodes connecting the plurality of resistors or diodes and an output terminal, and the remanent polarization removing voltage output from the output terminal can change in accordance with the presence/absence of fusing of the fuses.

Furthermore, the plate line voltage generating circuit can comprise a plurality of resistors connected in series between a power terminal and a ground terminal, a plurality of transistors each having a source and drain connected between nodes connecting the resistors and an output terminal, and a control circuit connected to a gate of each of the transistors, and the control circuit can apply a voltage to the gate of the transistor to control conduction in accordance with an externally given command, thereby changing the remanent polarization removing plate line voltage output from the output terminal.

In the semiconductor memories and their testing methods according to the present invention described above, polarization remaining in a ferroelectric capacitor is removed after testing. Consequently, it is possible to prevent the ferroelectric capacitor from causing imprint by thermal history in steps after the testing steps, thereby preventing deterioration of the characteristics and shortening of the product life.

BRIEF DESCRIPTION OF THE DRAWINGS

FIG. 11 is a circuit diagram showing the arrangement of a 2T2C cell in the semiconductor memory according to the second embodiment;

FIG. 12 is a circuit diagram showing the arrangement of a circuit for erasing remanent polarization in the 2T2C cell.

DESCRIPTION OF THE PREFERRED EMBODIMENTS

Embodiments of the present invention will be described in detail below with reference to the accompanying drawings.

Figure 1:
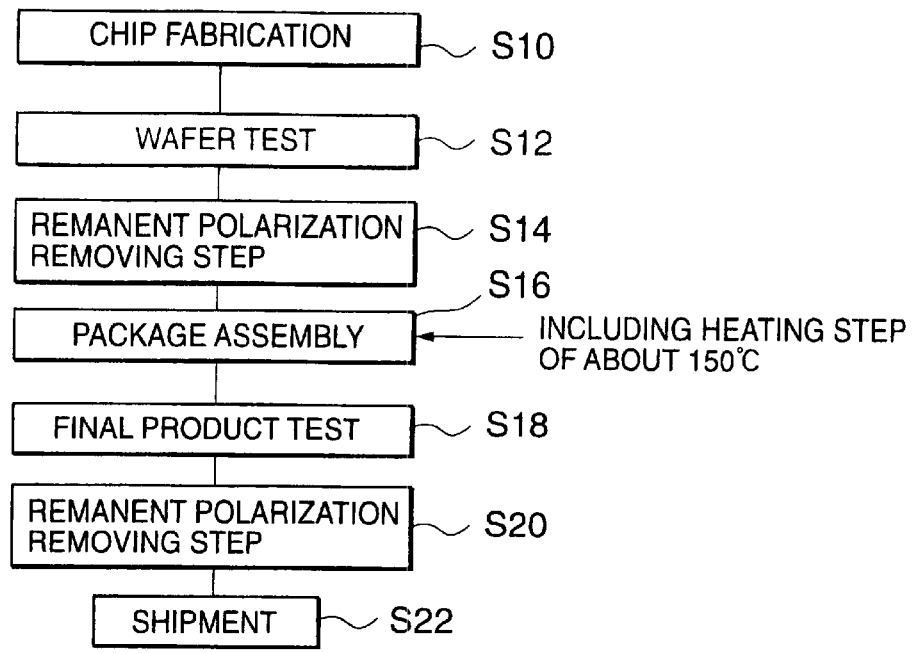
FIG. 1 is a flow chart showing the flow of steps in a semiconductor memory testing method according to the first embodiment of the present invention.

A semiconductor memory testing method according to the first embodiment of the present invention includes steps as shown in FIG. 1.

In step S10, semiconductor chips are fabricated in units of semiconductor wafers. In step S12, semiconductor wafers are tested one by one. In this step, writes and erases to ferroelectric memories are performed.

In step S14, polarization remaining in ferroelectric capacitors is removed.

In step S16, the wafers are diced to package/assemble chips. In step S18, the final products are tested. In this step, write and erase tests are conducted, and polarization remains in ferroelectric capacitors. In step S20, this remanent polarization is removed. In step S22, the products are shipped.

The characteristic feature of this embodiment is that after writes and erases to ferroelectric memories are performed in step S12 and before the flow advances to the package assembly step in step S16, the remanent polarization amount in ferroelectric capacitors is reduced in step S14.

As described above, after polarization remains in ferroelectric capacitors in the testing step in step S12 and before heat is applied in the package assembly step in step S16, the remanent polarization is removed in step S14. This prevents ferroelectric capacitors from causing imprint and deteriorating.

Furthermore, removing remanent polarization in step S20 before product shipment prevents ferroelectric capacitors from causing imprint after the shipment. This remanent polarization amount in ferroelectric capacitors must be removed until its absolute value becomes smaller than the absolute value of a remanent polarization amount produced in normal operation.

The step of reducing the polarization remaining in ferroelectric capacitors is realized as follows. Ferroelectric memories are classified into a 1T1C memory in which one memory cell is formed by one transistor and one capacitor, and a 2T2C memory in which one memory cell is formed by two transistors and two capacitors. In this embodiment, a case in which the present invention is applied to a 1T1C ferroelectric memory will be explained first, and changes when the present invention is applied to a 2T2C ferroelectric memory will be described later.

Figure 2:
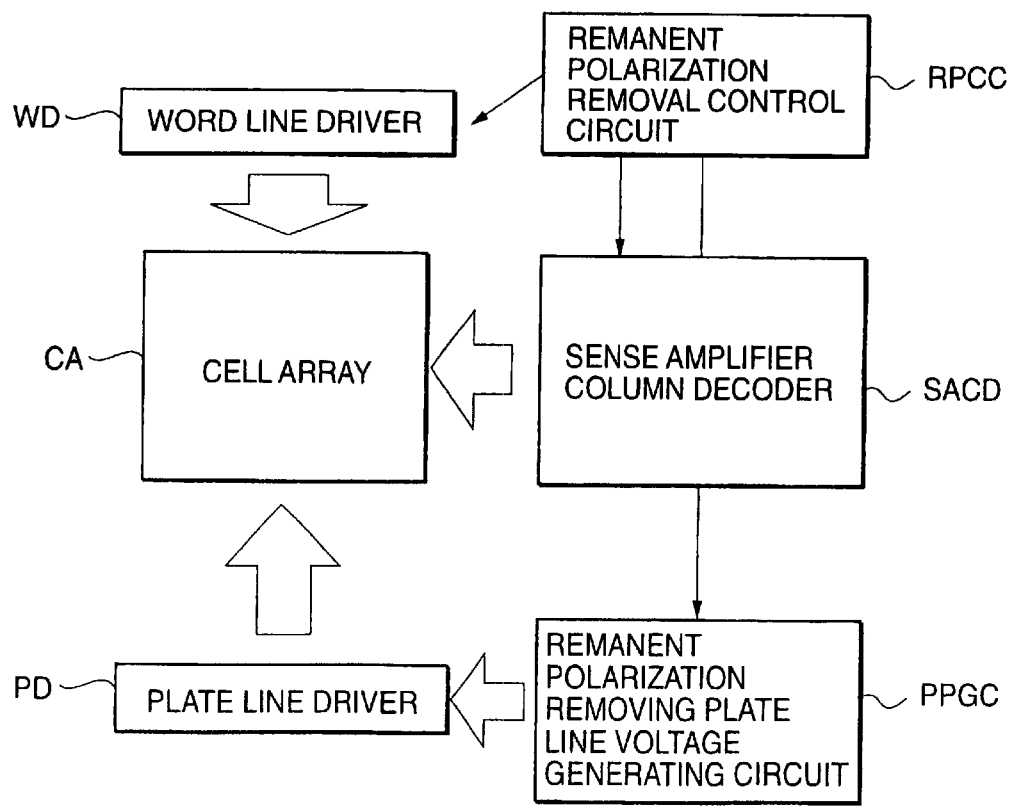
FIG. 2 is a block diagram showing the configuration of a semiconductor memory according to the second embodiment of the present invention.

FIG. 2 shows the block configuration of a semiconductor memory according to the second embodiment of the present invention, which realizes the step of reducing the remanent polarization amount in ferroelectric capacitors. This ferroelectric memory includes a cell array CA, a word line driver WD, a remanent polarization removal control circuit RPCC, a sense amplifier/column decoder SACD, a remanent polarization removing plate line voltage generating circuit PPGC, and a plate line driver PD.

In the cell array CA, memory cells are arranged in the form of an array. Memory cells in a row direction are connected together to a plurality of word lines running in the row direction.

Memory cells in a column direction are connected together to a plurality of bit lines running in the column direction. Each memory cell is either a 1T1C cell or a 2T2C cell as described above.

The word line driver WD selects a word line when applied with a row-direction selecting signal from a row decoder (not shown).

The sense amplifier/column decoder SACD selects a bit line in the column direction and also reads out data written in a memory cell connected to the selected word line and bit line.

The remanent polarization removal control circuit RPCC causes the word line driver WD to selectively drive a word line of a memory cell from which remanent polarization is to be removed.

The remanent polarization removing plate line voltage generating circuit PPGC generates a plate line voltage for driving a plate line of a memory from which remanent polarization is to be removed, and supplies the voltage to the plate line driver PD.

The plate line driver PD receives the plate line voltage generated by the remanent polarization removing plate line voltage generating circuit PPGC and applies the voltage to the selected plate line. This remanent polarization removing plate line voltage is set to be lower than a plate voltage in normal data write.

As described above, the semiconductor memory according to this embodiment has the arrangement by which a voltage lower than that in common data write is applied to a plate line of a ferroelectric memory cell from which remanent polarization is to be removed.

Figure 3:
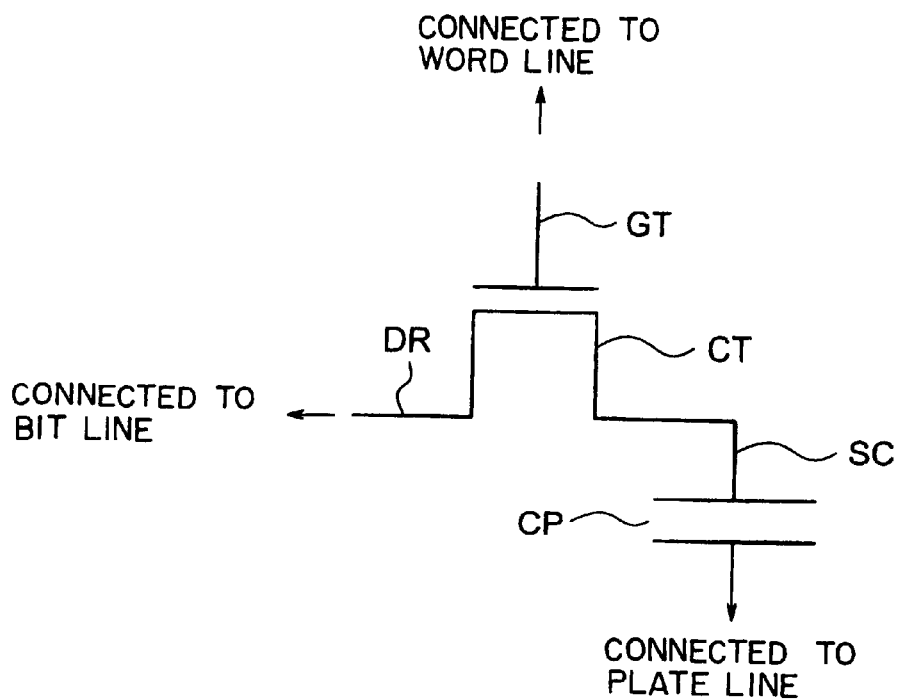
FIG. 3 is a circuit diagram showing the arrangement of a 1T1C cell of the semiconductor memory.

The semiconductor memory according to this embodiment having the above configuration operates as follows. FIG. 3 shows the arrangement of each memory cell in the cell array CA. This memory cell is a 1T1C cell. A gate GT, a drain DR, and a source SC of a cell transistor CT are connected to a word line (not shown), bit line (not shown), and one terminal of a ferroelectric capacitor CP, respectively. The other terminal of the capacitor CP is connected to a plate line (not shown).

In the testing step shown as step S12 in FIG. 1, data is written in a memory cell by a common method. Assume that data written by setting the potential of a bit line to be higher than the potential of a plate line is "1" data, and data written by setting the potential of a plate line to be higher than the potential of a bit line is "0" data.

The removal of polarization remaining in ferroelectric capacitors in step S14 is performed by the following two steps.

First, "1" data is written in all bits in a semiconductor chip.

Subsequently, in this semiconductor chip, 0 (V) is applied to bit lines contained in a block from which remanent polarization is to be removed. Furthermore, the remanent polarization removal control circuit RPCC and the word line driver WD are operated to apply a power-supply voltage Vcc to word lines in the block, thereby opening the gates GT of the cell transistors CT to be selected. After that, the remanent polarization removing plate line voltage generating circuit PPGC and the plate line driver PD are operated to apply the remanent polarization removing plate line voltage to the plate lines for a predetermined time. As described above, this remanent polarization removing plate line voltage is set to be lower than a voltage V2 in normal writing. A remanent polarization removing plate line voltage V1 is desirably approximately equal to or slightly larger than the coercive voltage V2 of a ferroelectric capacitor.

Following the procedure as described above, remanent polarization in capacitors in that block is removed. A block indicating a unit by which polarization is removed at one time can be set for either a part or the whole of the cell array CA of a semiconductor chip. When a block is set for a part of the cell array CA, the above processing is performed in turn for the number of blocks to remove polarization from the whole cell array CA.

To reduce the time required for the remanent polarization removing step, it is desirable to remove remanent polarization of the entire cell array CA at once. However, this increases the number of ferroelectric capacitors CP to be driven compared to that in common write operation. Therefore, the RC delay amount becomes larger than in normal writing, so the application time of the remanent polarization removing plate line voltage prolongs. This should be taken into consideration.

The voltage to be applied to plate lines in the remanent polarization removing step can be (1) supplied from outside the chip or (2) generated inside the chip. When a memory includes a means for generating the applied voltage inside the chip in accordance with the method (2), it is desirable to control the generated voltage from outside the chip. A method of externally controlling the generated voltage can be (2a) a method of controlling the generated voltage by externally giving a command or (2b) a method of controlling the generated voltage in accordance with the presence/absence of fusing of a fuse. By externally controlling the voltage to be applied to plate lines in the remanent polarization removing step by using either method, the applied voltage can be set at an appropriate value even when the characteristics of ferroelectric capacitors change with fluctuations of the fabrication process.

As a method of setting the applied voltage at an optimum value, it is possible to measure a test pattern formed in a region, such as a dicing line, having no influence on a chip area, thereby setting the voltage at a value corresponding to the characteristics of ferroelectric capacitors. For example, this test pattern can be formed by connecting in parallel a plurality of capacitors having the same dimensions as ferroelectric capacitors contained in a memory cell.

Figure 6:
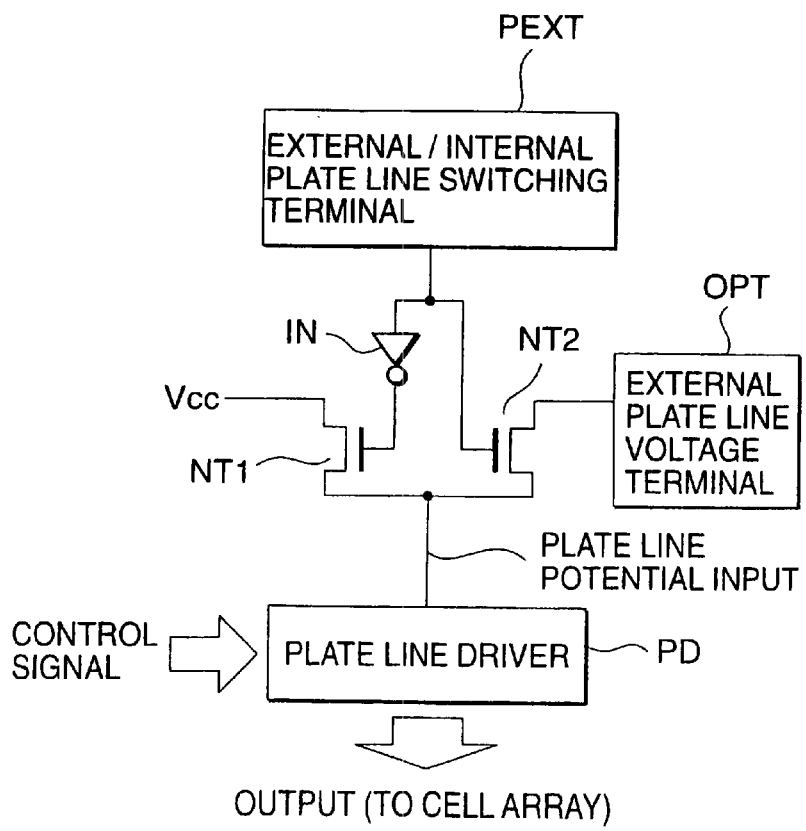
FIG. 6 is a circuit diagram showing the arrangement of a plate line voltage generating circuit in the semiconductor memory according to the second embodiment.

A practical configuration of a circuit for supplying, from outside the chip, the voltage to be applied to plate lines to remove remanent polarization will be described below. A plate line voltage generating circuit shown in FIG. 6 includes an external/internal plate line switching terminal PEXT, an external plate line voltage terminal OPT, n-channel transistors NT1 and NT2, an inverter IN, and a plate line driver PD. The drain, gate, and source of the transistor NT1 are connected to a power-supply voltage Vcc terminal, the external/internal plate line switching terminal PEXT, and the input terminal of the plate line driver PD, respectively. The drain, gate, and source of the transistor NT2 are connected to the external plate line voltage V terminal OPT, the external/internal plate line switching terminal PEXT, and the input terminal of the plate line driver PD, respectively.

In this voltage generating circuit, an input switching signal is applied to the plate line switching terminal PEXT, and the plate line voltage is applied to the external plate line voltage terminal OPT. In normal operation, the ground potential is given as the input switching signal. In this case, the transistor NT1 is turned on and the transistor NT2 is turned off. Accordingly, the power-supply voltage Vcc is supplied to the plate line driver PD. Hence, the power-supply voltage Vcc is used as the potential to be applied to a plate line.

To supply a plate line voltage smaller than in normal operation to a plate line in remanent polarization removal, the power-supply voltage Vcc is applied to the switching terminal PEXT. In this case, the transistor NT1 is turned off and the transistor NT2 is turned on. Therefore, the plate line voltage applied to the external plate line voltage terminal OPT is used. The advantage of this method is that the potential of a plate line can be externally freely set during polarization removal.

In this circuit configuration, however, the switching terminal PEXT and the plate line voltage terminal OPT increase the number of external terminals. In addition, when package assembly is performed, optional terminals such as the switching terminal PEXT and the plate line voltage terminal DPT are not usually connected to package terminals. This makes it difficult to perform remanent polarization removal in step S20 shown in FIG. 1 after package assembly is performed in step S16.

Figure 7:
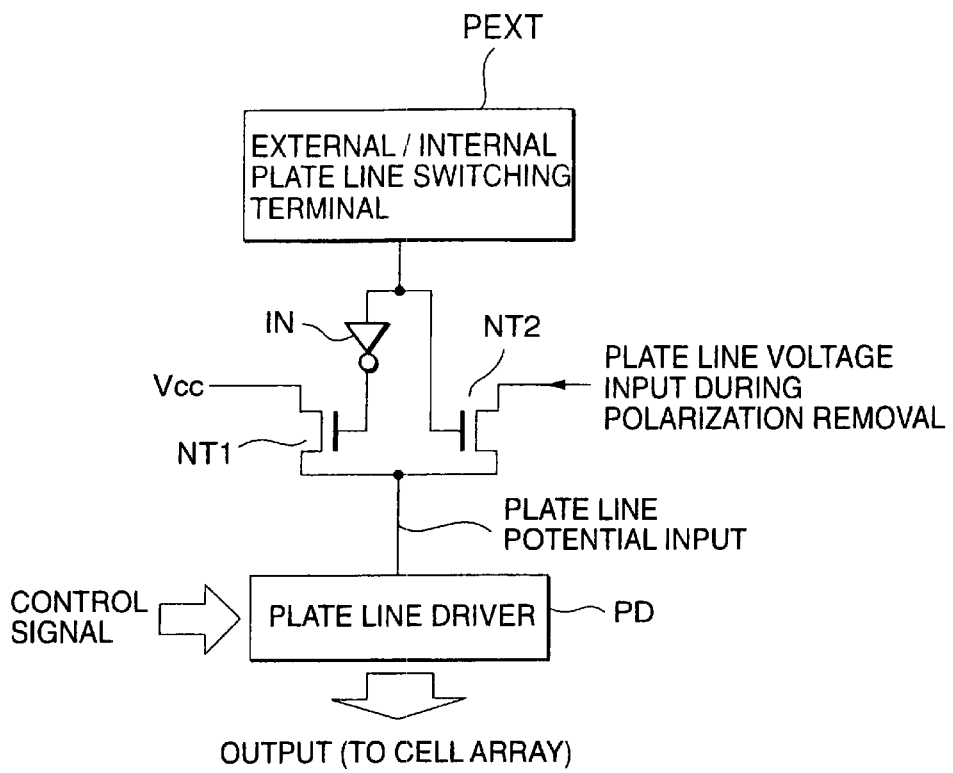
FIG. 7 is a circuit diagram showing the arrangement of another plate line voltage generating circuit in the same semiconductor memory.

In contrast, a plate line voltage generating circuit shown in FIG. 7 generates a remanent polarization removing plate line voltage inside the chip. Unlike the circuit shown in FIG. 6, the output terminal of a voltage output circuit is connected to the drain of a transistor NT2. When the ground potential is applied to a switching terminal PEXT, the power-supply voltage Vcc is applied to a plate line. When the power-supply voltage Vcc is applied to the switching terminal PEXT, a plate line voltage input from the drain of the transistor NT2 is applied to a plate line. A switching signal can be generated inside the chip by a command given from outside the chip, instead of being externally input from the switching terminal PEXT. When the memory is thus constructed, the number of external terminals of the chip can be decreased.

Figure 8:
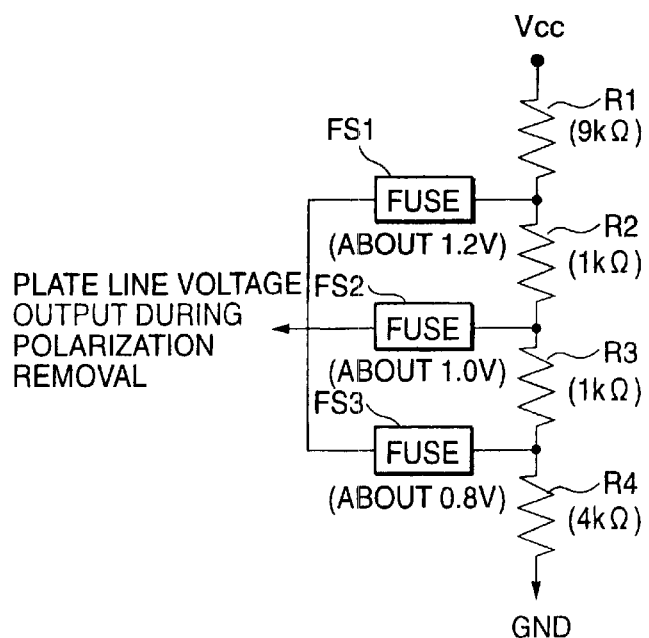
FIG. 8 is a circuit diagram showing the arrangement of a plate line potential output circuit in the plate line voltage generating circuit shown in FIG. 7.
Figure 9:
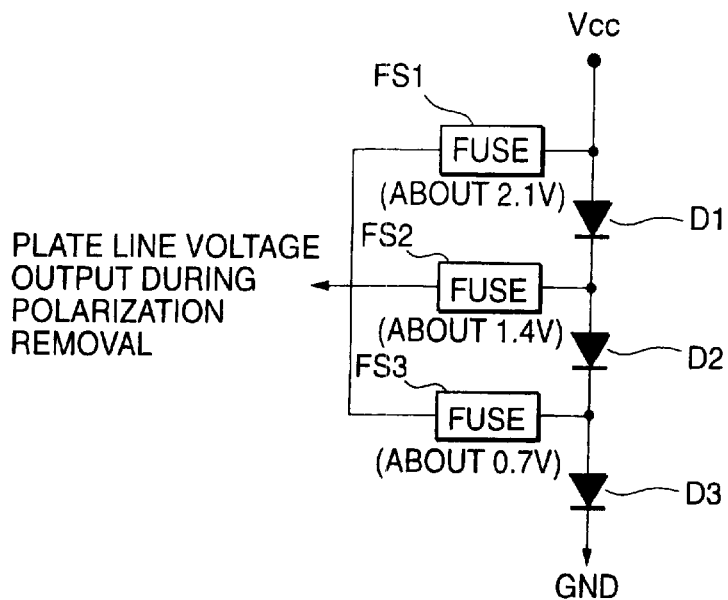
FIG. 9 is a circuit diagram showing the arrangement of another plate line potential output circuit in the plate line voltage generating circuit shown in FIG. 7.
Figure 10:
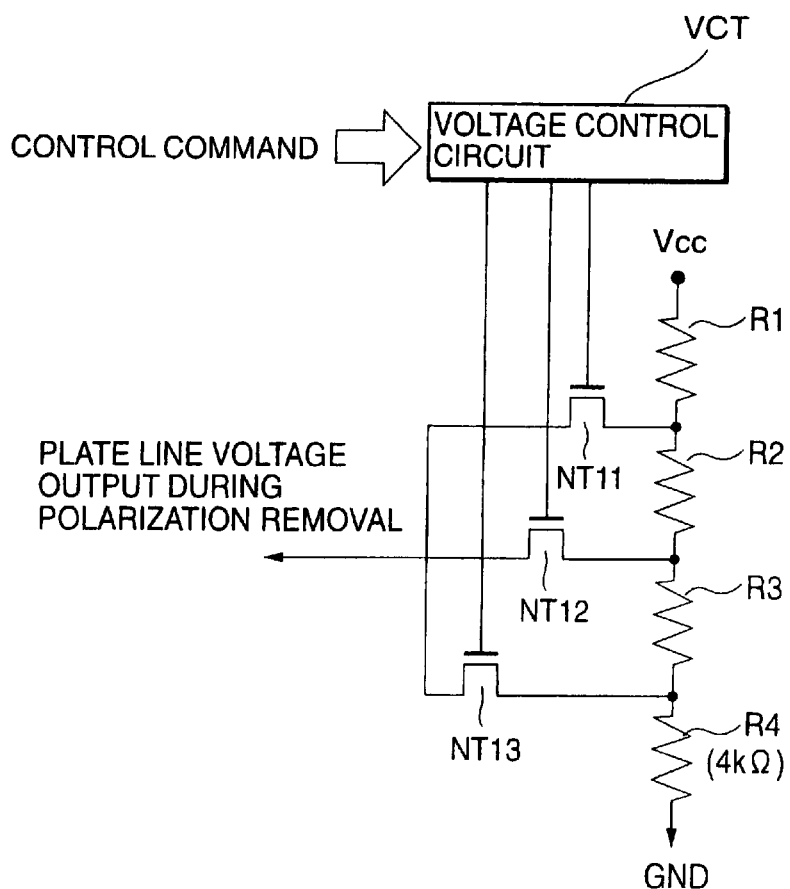
FIG. 10 is a circuit diagram showing the arrangement of still another plate line potential output circuit in the plate line voltage generating circuit shown in FIG. 7.
Figure 13:
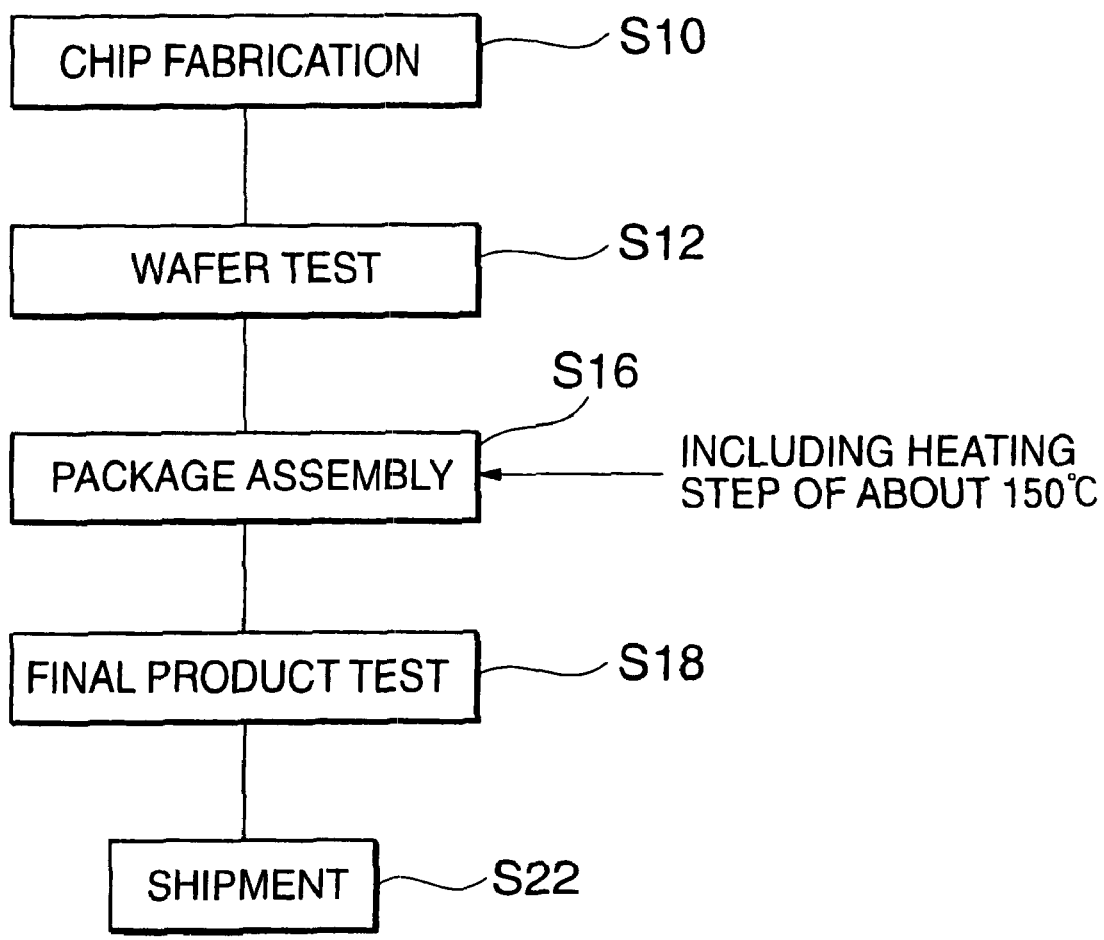
FIG. 13 is a flow chart showing the flow of steps in a semiconductor memory testing method relevant to the present invention.

FIGS. 8, 9, and 10 show practical arrangements of a voltage generating circuit connected to the transistor NT2. A voltage generating circuit shown in FIG. 8 generates a desired potential by voltage division using resistance. A plurality of resistors R1 to R4 are connected in series between a power-supply voltage Vcc terminal and a ground terminal. Terminals at one end of fuses FS1, FS2, and FS3 are connected to the connection nodes between the resistors R1 and R2, R2 and R3, and R3 and R4, respectively, and their terminals at the other end are connected together to the drain of the transistor NT2. A plate line voltage to be output changes in accordance with the presence/absence of fusing of each of the fuses FS1 to FS3.

In a circuit shown in FIG. 9, the resistors R1 to R3 in the circuit shown in FIG. 8 are replaced with diodes D1 to D3. This circuit can generate a desired potential by using the bandgap potential.

A circuit shown in FIG. 10 generates a desired potential by dividing a power-supply voltage using resistance similar to the circuit shown in FIG. 8. However, a potential is selected by externally inputting a control command, not in accordance with the presence/absence of fusing of a fuse. Resistors R1 to R4 are connected in series between a power-supply voltage Vcc terminal and a ground terminal. The drain of an n-channel transistor NT11 is connected to the connection node between the resistors R1 and R2. The drain of an n-channel transistor NT12 is connected to the connection node between the resistors R2 and R3. The drain of an n-channel transistor NT13 is connected to the connection node between the resistors R3 and R4. The sources of these transistors NT11 to NT13 are connected together to the drain of the transistor NT2. In addition, a control command is externally input to a power control circuit VCT. The gates of the transistors NT11 to NT13 are connected to the output terminal of this circuit VCT. When a control command is externally input to the voltage control circuit VCT, each of the transistors NT11 to NT13 is turned on or off in accordance with this control command. Consequently, a desired one of voltages generated by resistance division is output as a plate voltage. In the voltage generating circuit shown in FIG. 10, a voltage can be selected by a control command without forming any external terminals as described above. Accordingly, the number of external terminals can be reduced.

Furthermore, when the voltage generating circuit shown in FIG. 10 is used, even after package assembly is performed it is possible to remove remanent polarization by selecting a proper voltage by externally giving a control command and applying this voltage to a plate line.

Removal of remanent polarization in a 1T1C ferroelectric memory has been described above. This can be performed in a 2T2C ferroelectric memory as follows. In a 2T2C ferroelectric memory, as shown in FIG. 11, each memory cell has a pair of 1T1C cells.

Drains DR1 and DR2 of cell transistors CT1 and CT2 are connected to a pair of bit lines BL and /BL, respectively. Gates GT1 and GT2 of the transistors CT1 and CT2 are connected together to a word line WL. Sources SC1 and SC2 of the transistors CT1 and CT2 are connected to terminals at one end of ferroelectric capacitors CP1 and CP2, respectively. Terminals at the other end of the ferroelectric capacitors CP1 and CP2 are connected together to a plate line PL.

In this 2T2C memory cell, data having different polarities are written in the two ferroelectric capacitors CP1 and CP2 in data write operation. Accordingly, "1" data cannot be written in both the ferroelectric capacitors CP1 and CP2. To remove remanent polarization from this 2T2C memory cell, therefore, a remanent polarization removing write circuit for writing "1" data in all ferroelectric capacitors is necessary unlike in normal write action. More specifically, this write circuit need only have an arrangement by which the bit lines BL and /BL can be set at the ground potential at the same time.

FIG. 12 shows an example of the arrangement of the remanent polarization removing write circuit. Terminals at one end of transistors T1 and T2 are connected together to a bit line BL. The other terminal of the transistor T1 is connected to a remanent polarization removing voltage power line PL. The other terminal of the transistor T2 is connected to a ground line GL. Terminals at one end of transistors T3 and T4 are connected together to a bit line /BL. The other terminal of the transistor T3 is connected to the remanent polarization removing voltage power line PL. The other terminal of the transistor T4 is connected to the ground line GL. The gates of the transistors T1 and T3 are connected to a power-supply voltage application signal line PSL. The gates of the transistors T2 and T4 are connected to a ground voltage application signal line GSL. A sense amplifier operation indication signal line SAIL is connected to the control terminal of a sense amplifier S/A1. A data output terminal DOT is connected to the bit line BL.

To remove remanent polarization, each potential is set as follows. The sense amplifier operation indication signal line SAIL is set at a ground potential Vss to inactivate the sense amplifier S/A1. The power-supply voltage application signal line PSL is set at a power-supply voltage Vcc to turn on the transistors T1 and T3. The ground voltage application signal line GSL is set at the ground voltage Vss to turn off the transistors T2 and T4. In addition, the remanent polarization removing voltage line PL is set at an appropriate voltage for remanent polarization removal. Consequently, remanent polarization in the ferroelectric capacitors CP1 and CP2 can be removed.

Figure 4:
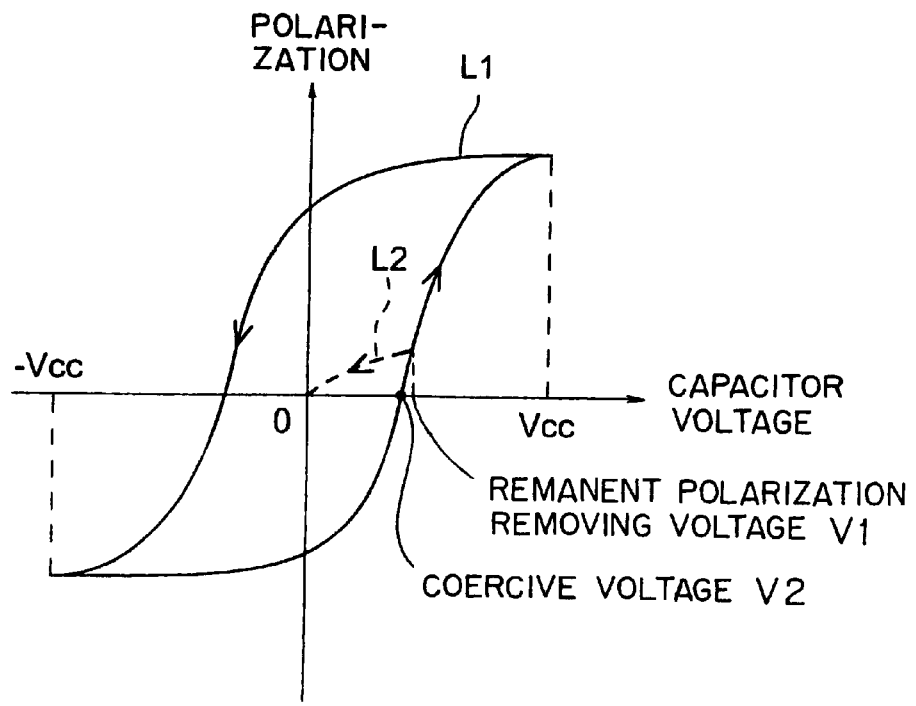
FIG. 4 is a graph showing the relationship between the voltage applied across a ferroelectric capacitor and the polarization.

FIG. 4 shows the relationship between the voltage applied across each of the ferroelectric capacitors CP1 and CP2 and the polarization of each capacitor. The capacitor polarization amount has a hysteresis characteristic: polarization changes in the direction of an arrow with changes in the voltage.

As shown in FIG. 4, a coercive voltage V2 is the capacitor voltage when the polarization is "0". In normal operation, the power-supply voltage Vcc or −Vcc is applied to each capacitor. Hence, the capacitor polarization amount changes along a solid line L1. Polarization is not "0" even when the voltage applied to the capacitor is removed and "0" volt, so remanent polarization exists. However, when the voltage applied to the capacitor is changed to "0" V from a voltage V1 which is slightly larger than the coercive voltage V2, the polarization changes along a curve as indicated by a broken line L2. In this case, the remanent polarization amount becomes "0" V when the voltage applied to the capacitor becomes "0" V.

As described above, the remanent polarization amount of a capacitor can be reduced to "0" by setting the voltage applied to the capacitor to the voltage V1 which is slightly higher than the coercive voltage V2.

In the semiconductor memory according to the second embodiment described above, in the remanent polarization removing step, remanent polarization is removed by applying an appropriate voltage to a plate line. A semiconductor memory according to the third embodiment of the present invention differs from the second embodiment in that remanent polarization is removed by applying a proper voltage to a bit line BL.

A semiconductor memory according to this embodiment includes a circuit which, when removing remanent polarization, applies a voltage smaller than that in normal write action to a bit line. A polarization removing operation is done by two steps as in the second embodiment described above.

First, "0" data is written in all memory cells.

Subsequently, a word line potential is applied to word lines of a block from which remanent polarization is to be removed, thereby raising these word lines. Also, a voltage smaller than that in normal write operation is applied to bit lines for a predetermined time.

This bit line voltage is desirably approximately equal to or slightly larger than the coercive voltage of a ferroelectric capacitor. The word line voltage must be a potential capable of well transferring this bit line voltage to a pair of bit lines BL and /BL. Through these steps, remanent polarization in ferroelectric capacitors can be removed in the same manner as in the above second embodiment.

The processing in the second step described in this embodiment can also be performed as follows.

First, a power-supply voltage Vcc is applied to bit lines of a block from which remanent polarization is to be removed, and a word line potential is applied to word lines of the block.

This word line potential is set such that a voltage approximately equal to the coercive voltage of a ferroelectric capacitor is transferred to capacitors. When a sufficient voltage is applied to the drain of a cell transistor, a potential transferred to the source of the transistor is generally given by gate voltage (Vgs)–transistor threshold value (Tth). Therefore, the word line potential (=gate voltage) is so set that this value (Vgs–Vth) is equal to the coercive voltage of a ferroelectric capacitor.

In either case, the voltage of a bit line or word line during remanent polarization removal is desirably controllable from outside the chip in order to control changes in characteristics resulting from process fluctuations. As word line voltage and bit line voltage generating means for removing remanent polarization, the circuits described in the second embodiment can be used.

The fourth embodiment of the present invention relates to a method of removing remanent polarization in an MFS (Metal Ferroelectrics Silicon) or MFMIS (Metal Ferroelectrics Metal Insulator Silicon)-FET ferroelectric memory.

Figure 5:
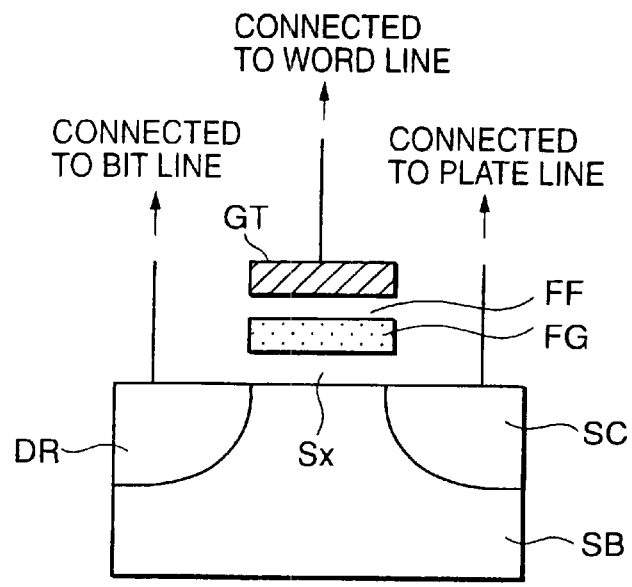
FIG. 5 is a longitudinal sectional view showing the arrangement of a cell of an MFMIS-FET type ferroelectric memory.

FIG. 5 shows the cell structure of this MFMIS-FET ferroelectric memory. A drain DR and a source SC are formed in a surface portion of a silicon substrate SB. On a channel region between these drain DR and source SC, a silicon oxide film SX, a floating gate FG made of a polysilicon film, a ferroelectric film FF, and a gate electrode GT made of a polysilicon film are formed in this order. The drain DR, the source SC, and the gate electrode GT are connected to a bit line, plate line, and word line, respectively. The floating gate electrode FG, the ferroelectric film FF, and the gate electrode GT form a ferroelectric capacitor.

In this memory cell, "1" or "0" data is written by applying a positive or negative voltage between the gate electrode GT and the silicon substrate SB. Assume that data written when a positive voltage is applied is "1", and data written when a negative voltage is applied is "0".

Also in this embodiment, remanent polarization removal is done by two steps as in the first to third embodiments described above.

First, "0" data is written by applying a negative voltage to the gate electrodes GT of all memory cells. After that, a positive voltage lower than that in normal write operation is applied to the gate electrodes GT of all memory cells, thereby removing remanent polarization.

This applied voltage is desirably set to be approximately equal to or slightly larger than the coercive voltage of a ferroelectric capacitor. Also, remanent polarization can be removed from the whole cell array at once or divisionally removed in units of blocks. When remanent polarization is to be divisionally removed in units of blocks, the above-mentioned processing is repeated a plurality of times to remove remanent polarization from all bits in the chip.

Each of the aforementioned embodiments is merely an example and hence does not restrict the present invention. For instance, in the fourth embodiment described above, "0" data is written in all memory cells in the first step of remanent polarization removal, and a positive voltage is applied to the gate electrodes to remove remanent polarization. However, it is also possible to write "1" data in all memory cells in the first step and subsequently apply a negative voltage to the gate electrodes to remove remanent polarization.

What is claimed is:

1. A semiconductor memory comprising:
   a cell array in which a plurality of memory cells each including a ferroelectric capacitor are arranged; and
   a write circuit for writing data in said memory cells, said write circuit removing polarization remaining in said ferroelectric capacitor by applying a voltage lower than a voltage in normal operation to a plate line connected to said memory cell, such that an absolute value of polarization remaining in said ferroelectric capacitor is smaller than an absolute value of polarization remaining in normal operation.

2. A semiconductor memory comprising:
   a cell array in which a plurality of memory cells each including a ferroelectric capacitor are arranged;
   a plate line driver for applying a supplied voltage to a plate line connected to said memory cells;
   a plate line voltage generating circuit for generating a remanent polarization removing plate line voltage lower than a normal operation plate line voltage; and
   a switching circuit for selectively supplying, to said plate line driver, one of the normal operation plate line voltage given and the remanent polarization removing plate line voltage generated by said plate line voltage generating circuit,
   wherein when performing a normal operation, said switching circuit supplies the normal operation plate line voltage to said plate line driver to apply the voltage to said plate line, when removing remanent polarization from said ferroelectric capacitor, said switching circuit supplies the remanent polarization removing plate line voltage to said plate line driver to apply the voltage to said plate line, such that an absolute value of polarization remaining in said ferroelectric capacitor is smaller than an absolute value of polarization remaining in normal operation.

3. A memory according to claim 2, wherein said switching circuit is externally given a command and selectively supplies one of the normal operation plate line voltage and the remanent polarization removing plate line voltage to said plate line driver.

4. A memory according to claim 3, wherein
said plate line voltage generating circuit comprises:
   a plurality of resistors or diodes connected in series between a power terminal and a ground terminal; and
   a plurality of fuses connected between nodes connecting said plurality of resistors or diodes and an output terminal, and
   said remanent polarization removing voltage output from said output terminal changes in accordance with the presence/absence of fusing of said fuses.

5. A memory according to claim 3, wherein
said switching circuit comprises:
   a first switching element having a control terminal connected to an external terminal, an input terminal to which the normal operation plate line voltage is input, and an output terminal connected to an input terminal of said plate line driver; and
   a second switching element having said control terminal connected to said external terminal, an input terminal to which the remanent polarization removing plate line voltage is input, and an output terminal connected to an input terminal of said plate line driver, and
   one of said first and second switching elements is turned on in accordance with a signal input to said external terminal, thereby supplying one of the normal operation plate line voltage and the remanent polarization removing plate line voltage to said plate line driver.

6. A memory according to claim 3, wherein
said plate line voltage generating circuit comprises:
   a plurality of resistors connected in series between a power terminal and a ground terminal;
   a plurality of transistors each having a source and drain connected between nodes connecting said resistors and an output terminal; and
   a control circuit connected to a gate of each of said transistors, and
   said control circuit applies a voltage to the gate of said transistor to control conduction in accordance with an externally given command, thereby changing the remanent polarization removing plate line voltage output from said output terminal.

7. A memory according to claim 5, wherein
said plate line voltage generating circuit comprises:
   a plurality of resistors or diodes connected in series between a power terminal and a ground terminal; and
   a plurality of fuses connected between nodes connecting said plurality of resistors or diodes and an output terminal, and
   said remanent polarization removing voltage output from said output terminal changes in accordance with the presence/absence of fusing of said fuses.

8. A memory according to claim 5, wherein
said plate line voltage generating circuit comprises:
   a plurality of resistors connected in series between a power terminal and a ground terminal;
   a plurality of transistors each having a source and drain connected between nodes connecting said resistors and an output terminal; and
   a control circuit connected to a gate of each of said transistors, and
   said control circuit applies a voltage to the gate of said transistor to control conduction in accordance with an externally given command, thereby changing the remanent polarization removing plate line voltage output from said output terminal.

* * * * *